United States Patent
Jang

(10) Patent No.: US 10,262,753 B2
(45) Date of Patent: Apr. 16, 2019

(54) AUXILIARY TEST DEVICE, TEST BOARD HAVING THE SAME, AND TEST METHOD THEREOF

(71) Applicant: Samsung Electronics Co., Ltd., Suwon-si (KR)

(72) Inventor: Ungjin Jang, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 299 days.

(21) Appl. No.: 15/165,312

(22) Filed: May 26, 2016

(65) Prior Publication Data
US 2017/0010304 A1     Jan. 12, 2017

(30) Foreign Application Priority Data
Jul. 8, 2015   (KR) .................. 10-2015-0097302

(51) Int. Cl.
G01R 31/26      (2014.01)
G11C 29/56      (2006.01)
G01R 31/319     (2006.01)
G11C 29/26      (2006.01)

(52) U.S. Cl.
CPC ........ *G11C 29/56* (2013.01); *G01R 31/31926* (2013.01); *G11C 2029/2602* (2013.01); *G11C 2029/5602* (2013.01)

(58) Field of Classification Search
CPC ........ G01R 31/31905; G01R 31/31926; G01R 31/3167; G01R 31/319
See application file for complete search history.

(56) References Cited

U.S. PATENT DOCUMENTS

| | | | |
|---|---|---|---|
| 6,628,137 B2 | 9/2003 | Mori et al. | |
| 7,062,690 B2 * | 6/2006 | Ernst ............... | G01R 31/31905 714/724 |
| 7,148,676 B2 | 12/2006 | Kamano et al. | |
| 7,319,936 B2 | 1/2008 | Reichert | |
| 7,769,559 B2 | 8/2010 | Reichert | |
| 8,258,803 B2 | 9/2012 | Hiraide et al. | |
| 8,604,813 B2 | 12/2013 | Kwon et al. | |
| 8,742,966 B2 * | 6/2014 | Yamaguchi .... | H03K 19/018521 341/144 |
| 9,076,555 B2 | 7/2015 | Wang et al. | |

(Continued)

FOREIGN PATENT DOCUMENTS

| | | |
|---|---|---|
| JP | 2002236150 | 8/2002 |
| JP | 2005009942 | 1/2005 |

(Continued)

*Primary Examiner* — Alesa Allgood
(74) *Attorney, Agent, or Firm* — Onello & Mello, LLP

(57) ABSTRACT

The test board may include sockets in which a plurality of devices-under-test (DUTs) is inserted, and an auxiliary test device connection tree electrically connected to the sockets. The auxiliary test device connection tree includes at least one first auxiliary test device receiving and outputting a test request from an external apparatus, and at least one second auxiliary test device generating a test clock and a test pattern in response to the test request outputted from the at least one first auxiliary test device, performing a test operation about at least one among the DUTs using the generated test pattern, and outputting whether or not of an error of the test operation to the at least one first auxiliary test device.

11 Claims, 9 Drawing Sheets

(56) References Cited

U.S. PATENT DOCUMENTS

| | | | |
|---|---|---|---|
| 2002/0118007 A1* | 8/2002 | Mori | G01R 31/319 |
| | | | 324/756.07 |
| 2002/0118017 A1 | 8/2002 | Mori et al. | |
| 2003/0002365 A1* | 1/2003 | Sato | G11C 29/006 |
| | | | 365/201 |
| 2004/0257066 A1 | 12/2004 | Kamano et al. | |
| 2006/0123296 A1 | 6/2006 | Reichert | |
| 2006/0200714 A1 | 9/2006 | Kamano et al. | |
| 2007/0005286 A1* | 1/2007 | Sato | G11C 29/56 |
| | | | 702/118 |
| 2008/0077350 A1 | 3/2008 | Reichert | |
| 2010/0052724 A1* | 3/2010 | Mizuno | G01R 31/31703 |
| | | | 324/750.3 |
| 2011/0181311 A1 | 7/2011 | Hiraide et al. | |
| 2013/0138383 A1 | 5/2013 | Filler et al. | |
| 2014/0253099 A1* | 9/2014 | Han | G01R 19/00 |
| | | | 324/126 |
| 2014/0289576 A1 | 9/2014 | Maekawa | |
| 2015/0028908 A1* | 1/2015 | Kushnick | G06F 11/2221 |
| | | | 324/750.05 |
| 2015/0100838 A1 | 4/2015 | Baek et al. | |

FOREIGN PATENT DOCUMENTS

| | | |
|---|---|---|
| JP | 4885316 | 2/2012 |
| KR | 20120095702 | 8/2012 |
| KR | 101232195 | 2/2013 |
| KR | 101240242 | 3/2013 |
| KR | 20150012209 | 2/2015 |

* cited by examiner

AUXILIARY TEST DEVICE, TEST BOARD HAVING THE SAME, AND TEST METHOD THEREOF

CROSS-REFERENCE TO RELATED APPLICATIONS

This U.S. non-provisional patent application claims priority under 35 U.S.C. § 119 to Korean Patent Application No. 10-2015-0097302 filed on Jul. 8, 2015, the entire contents of which are hereby incorporated by reference.

BACKGROUND

Exemplary embodiments in accordance with principles of inventive concepts described herein relate to an auxiliary test device, a test board including the same, and a test method thereof.

A conventional memory test method includes automatic test equipment (ATE) test and a mount test. For the ATE test, which is performed to detect a defective passive component due to an error of a memory manufacturing process, a test pattern is reproduced using a pattern generator configured with an algorithmic pattern generator (ALPG) so as to test a memory. The ATE is used to test a semiconductor device, and, because the performance of the semiconductor device as a device-under-test (DUT) has to be tested, an appropriate model capable of testing the performance of the semiconductor device is used. New equipment is required as the performance of a semiconductor device is improved and a function thereof changes.

SUMMARY

Exemplary embodiments in accordance with principles of inventive concepts may provide a test board and an auxiliary test device which use a built out self-test (BOST) technique and a test method thereof.

One aspect of exemplary embodiments in accordance with principles of inventive concepts is directed to provide a test board including sockets in which a plurality of devices under test (DUTs) is inserted, and an auxiliary test device connection tree electrically connected to the sockets, the auxiliary test device connection tree including at least one first auxiliary test device receiving a first test request from an external apparatus and outputting a second test request, and at least one second auxiliary test device generating a test clock and a test pattern in response to the second test request outputted from the at least one first auxiliary test device, performing a test operation about at least one among the DUTs using the generated test pattern, and outputting whether or not of an error of the test operation to the at least one first auxiliary test device.

The external apparatus may be one of automatic test equipment (ATE) and a personal computer (PC).

The external apparatus and the connection tree of the auxiliary test device may be serially connected to each other.

The external apparatus and the connection tree of the auxiliary test device may be connected using a binary-tree structure.

The external apparatus and the connection tree of the auxiliary test device may be connected using a structure of at least two-chains.

The external apparatus and the connection tree of the auxiliary test device may be connected using a ring-network structure.

The external apparatus and the connection tree of the auxiliary test device may be connected using a two-lane structure.

The at least one first auxiliary test device may be a buffer chip

The buffer chip and at least one other buffer chip may be between the first auxiliary test device and the second auxiliary test device.

A frequency of the test clock may be higher than that of the test request outputted from the external apparatus.

The at least one second auxiliary test device may include a device-under-test (DUT) interface outputting a test pattern to the at least one DUT, receiving test result values corresponding to the test pattern from the at least one DUT, comparing the test pattern and the test result values, and determining whether or not of an error based on the compared result, a test logic circuit corresponding to the second test request and generating the test clock and the test pattern, and a communication circuit communicating with the at least one first auxiliary test device.

Another aspect of embodiments of exemplary embodiments in accordance with principles of inventive concepts is directed to provide an auxiliary test device including a DUT interface connected to a plurality of DUTs, outputting a test pattern to the DUTs, receiving test result values from the DUTs, and comparing the test pattern and the test result values, thereby determining whether or not of an error, a test logic circuit corresponding to a test request and generating a test clock or the test pattern, and a communication circuit communicating with a first apparatus using an up-link, and communicating with a second apparatus using a down-link.

The DUT interface may include at least one driver outputting the test pattern to the DUTs, or receiving the test result values from the DUTs, and at least one comparator comparing the test pattern and the test result values.

The first apparatus may be one among automatic test equipment (ATE), a personal computer (PC), and other auxiliary test device.

The other auxiliary test device may be implemented to be different from the auxiliary test device.

The other auxiliary test device may be implemented using the same manner as the auxiliary test device The second apparatus may be other auxiliary apparatus implemented using the same manner as the auxiliary test device.

The communication circuit may include an up-link transmitter/receiver for performing a communication with the first apparatus, a down-link transmitter/receiver for performing a communication with the second apparatus, and a link manipulation circuit controlling the up-link transmitter/receiver and the down-link transmitter/receiver, and activating the test logic circuit.

The up-link transmitter/receiver and the down-link transmitter/receiver may perform data communication using a point to point protocol (PPP) interface.

The auxiliary test device may be implemented using field programmable gate array (FPGA) or an application specific integrated circuit (ASIC).

Another aspect of embodiments of exemplary embodiments in accordance with principles of inventive concepts is directed to provide a test method of a test system including receiving a test request inputted from a first auxiliary test device, generating a test pattern corresponding to the test request at a second auxiliary test device, testing DUTs connected to the second auxiliary test device using the test pattern therefrom, and outputting whether or not of an error of the testing at the second auxiliary test device to the first auxiliary test device, the first and second auxiliary test devices are the same communication circuit to transmit and receive data.

The test method may further include the outputting the test request from the second auxiliary test device to a third auxiliary test device.

The first auxiliary test device may be a buffer chip or a built out self-test (BOST).

Still another aspect of embodiments of exemplary embodiments in accordance with principles of inventive concepts is directed to provide a test board including a first auxiliary test device corresponding to a first test request inputted from an external apparatus and testing a plurality of first DUTs, and a second auxiliary test device corresponding to a second test request inputted from the first auxiliary test device and testing a plurality of second DUTs, the first auxiliary test device and the second auxiliary test device communicate via a serial interface.

In exemplary embodiments in accordance with principles of inventive concepts a test system includes test devices, each test device including a device under test (DUT) interface including a transceiver configured to transmit test signals to and receive test result signals from a device under test and a comparator to compare test result signals to determine whether the DUT has encountered an error; test logic circuitry configured to generate a test pattern in response to a test request; and a communication circuit including uplink and downlink transceivers and a control circuit that is configured to activate the test logic circuitry in response to a test request, to pass a test result to an external device through the uplink or downlink transceiver, and to pass a test request through an uplink or downlink transceiver.

In exemplary embodiments in accordance with principles of inventive concepts, first and second test devices are connected through downlink and uplink transceivers and the first test device is configured to pass a test request to the second test device and the second test device is configured to pass a test result to the first test device through their respective communication circuits.

In exemplary embodiments in accordance with principles of inventive concepts, test devices are connected in a binary tree structure.

In exemplary embodiments in accordance with principles of inventive concepts, test devices are connected in a ring structure.

In exemplary embodiments in accordance with principles of inventive concepts, test devices are connected in a two chain structure.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
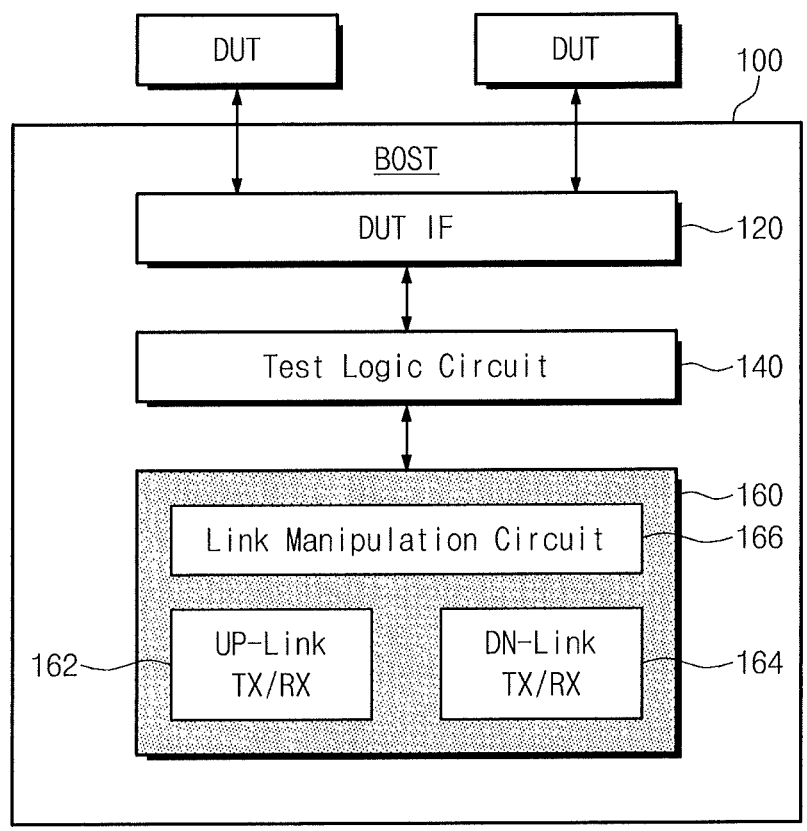
FIG. 1 is a block diagram illustrating a built out self-test (BOST) apparatus according to exemplary embodiments in accordance with principles of inventive concepts.

Exemplary embodiments in accordance with principles of inventive concepts may be embodied in various modifications and forms and may be exemplarily described in the accompanying drawings. The various embodiments may be described with reference to the drawings. Exemplary embodiments in accordance with principles of inventive concepts, however, may be embodied in various different forms, and should not be construed as being limited only to the illustrated embodiments. Rather, these embodiments are provided as examples so that this disclosure will be thorough and complete, and will fully convey the concept of exemplary embodiments in accordance with principles of inventive concepts to those skilled in the art. Accordingly, those of ordinary skill in the art will recognize that modification, equivalent, and/or alternative on the various embodiments described herein can be variously made without departing from the scope and spirit of the present disclosure. With regard to description of drawings, similar components may be marked by similar reference numerals It will be understood that, although the terms "first", "second", and the like, may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments in accordance with principles of inventive concepts.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. Other expressions describing a relation between structural elements, that is, "between" and "directly between" or "adjacent to" and "directly adjacent to", and the like may be interpreted similarly.

The terminology used herein is for the purpose of describing particular embodiments only and is not intended to be limiting of exemplary embodiments in accordance with principles of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a built out self-test (BOST) apparatus according to exemplary embodiments in accordance with principles of inventive concepts. Referring to FIG. 1, a BOST device 100 (also referred to as "auxiliary test device") may be a self-test apparatus for testing a plurality of to-be-tested devices (hereinafter referred to as "device under test (DUT)") and may include a DUT interface 120, a test logic circuit 140, and a communication circuit 160.

The DUT may be a volatile memory device such as a static random access memory (SRAM), a dynamic random access memory (DRAM), a synchronous dynamic RAM (SDRAM), and the like, a non-volatile memory device such as a read only memory (ROM), a programmable ROM (PROM), an erasable and programmable ROM (EPROM), an electrically erasable programmable ROM (EEPROM), a nor flash memory (NOR), a NAND flash memory, a vertical NAND flash memory (VNAND), a 3D memory, a phase change RAM (PRAM), a magnetic RAM (MRAM), a resistive RAM (RRAM), a ferroelectric RAM (FRAM), and the like, or a memory component having the volatile memory device and the non-volatile memory device, for example. In addition, the DUT may not be limited to a memory device or a memory package and may be, for example, a memory module (for example, DDR series, DIMM, NVDIMM) being a combination of memory components, a memory card, or a memory stick. Furthermore, the DUT may include chips such as an image signal processor (ISP) or a digital signal processor (DSP) which includes or does not include the memory device.

A test system in accordance with principles of inventive concepts may include a plurality of test devices, each test device including a device under test interface, test logic circuitry and a communications circuit. The device under test interface may include a plurality of transceivers configured to transmit test signals to and receive test result signals from a device under test and a comparator to compare test result signals to determine whether the DUT has encountered an error. The test logic circuitry may generate a test pattern in response to a test request, for example, from an external circuit. The communications circuit may include uplink and downlink transceivers and a control circuit. The control circuit may activate the test logic circuitry in response to a test request, may pass a test result to an external device, such as another similar test device, through the uplink or downlink transceiver, and may pass a test request through an uplink or downlink transceiver, for example, to another similar test device. A test system may include such test devices connected in serial, binary tree, ring, or other configurations, in accordance with principles of inventive concepts.

In FIG. 1, an exemplary embodiments in accordance with principles of inventive concepts is exemplified as two DUTs connected to one BOST device 100. However, it should be understood that the number of DUTs connected to the BOST device 100 of in accordance with principles of inventive concepts is not limited thereto. The BOST device 100 may be connected to three or more DUTs, for example.

The DUT interface 120 may provide a function of communicating with the DUT. In particular, the DUT interface 120 may transmit test signals (for example, a clock, an instruction, and/or test data) to the DUT and may receive a test result value from the DUT as a response to the test signals. In exemplary embodiments, the DUT interface 120 may be implemented using a high-speed serial interface.

The DUT interface 120 may include an input/output driver and a comparator, for example. The input/output driver may output a test pattern to the DUT, or may receive the test result value from the DUT. The comparator may compare the test result value with the test pattern and may determine whether an error occurs during a test operation.

The test logic circuit 140 may generate a clock, an address, test data, a test instruction, or test data (or test pattern) required for an AC test operation or a DC test operation, in response to a test request. In exemplary embodiments, a test request may be received from an external apparatus (for example, automatic test equipment (ATE), a personal computer (PC), or any other BOST) of the BOST device 100, for example.

The test logic circuit 140 may include a timing generator (TG), an algorithm pattern generator (ALPG), a pattern memory, a flow controller, and the like. The TG may generate a test clock required to perform a test operation. The ALPG may receive the test clock and may generate an address pattern, a data pattern, or a control pattern. The pattern memory may store the generated patterns, or may store basic information required to generate patterns. The flow controller may allocate the address pattern, the data pattern or the control pattern to a corresponding channel.

The communication circuit 160 may be implemented to transmit and receive data from and to an external apparatus (for example, an upstream device or a downstream device). The communication circuit 160 may include an up-link transmitter/receiver 162, a down-link transmitter/receiver 164, and a link manipulation circuit 166.

The up-link transmitter/receiver 162 may be implemented to communicate with the upstream device for uploading data. For example, the up-link transmitter/receiver 162 may receive a test request from the upstream device (for example, ATE) and may output a test result value to the upstream device. In exemplary embodiments, the test result value may be a result value of a test operation which is performed at the BOST device in response to a test request, or may be a test result value inputted from a downstream device (for example, other BOST device).

The down-link transmitter/receiver 164 may be implemented to communicate with the external apparatus for downloading the data. For example, the down-link transmitter/receiver 164 may output a test request to the downstream device or may receive a test result value inputted from the downstream device.

The link manipulation circuit 166 may be implemented to control the up-link transmitter/receiver 162 and the down-link transmitter/receiver 164 or to activate the test logic circuit 140. The link manipulation circuit 166 may determine whether to internally process a test request and/or a test result value inputted and outputted to and from the up-link transmitter/receiver 162 and the down-link transmitter/receiver 164, or whether to transmit the test request and/or the test result value to an external apparatus. This determination may be based on target object information related to the test request and the test result value.

The link manipulation circuit 166 may process the test-related information transmitted and received to and from the up-link transmitter/receiver 162 or the down-link transmitter/receiver 164, and may transmit the test-related information to the test logic circuit 140, for example.

In exemplary embodiments, each of the up-link transmitter/receiver 162 and the down-link transmitter/receiver in the communication circuit 160 may be implemented using a point to point protocol (PPP) interface. However, exemplary embodiments of communication circuit 160 of in accordance with principles of inventive concepts are not limited thereto. It may be understood that the communication circuit 160 is implemented using various types of communication interfaces.

In an exemplary embodiment, the BOST device 100 may be implemented using a field programmable gate array (FPGA) or an application specific integrated circuit (ASIC), for example.

The BOST device 100 according to an exemplary embodiment of in accordance with principles of inventive concepts may perform a communication with an external apparatus that transmits and receives the test-related data, thereby basically resolving channel constraint of a test operation.

Figure 2:
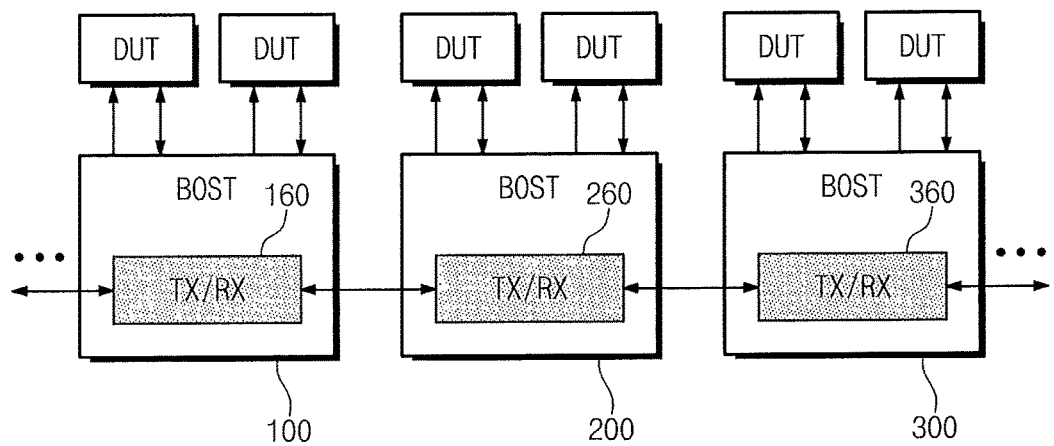
FIG. 2 is a diagram illustrating a serial connection between BOST devices according to exemplary embodiments in accordance with principles of inventive concepts.

FIG. 2 is a diagram illustrating a serial connection between BOST devices according to an exemplary embodiment in accordance with principles of inventive concepts. In FIG. 2, for convenience of description, an embodiment in accordance with principles of inventive concepts is exemplified as three BOST devices 100, 200 and 300 are serially connected.

Communication circuits 160, 260 and 360 of the BOST devices 100, 200 and 300 may be serially connected. A test request and a test result value may be transmitted via the communication circuits 160, 260 and 360.

For example, a first BOST device 100 may receive a test request, may perform a first test operation related to at least one DUT connected thereto, and may store a first test result value. During the first test operation, a second BOST device 200 may receive a test request outputted from the communication circuit 160 of the first BOST device 100, may perform a second test operation related to at least one DUT connected thereto, and may store a second test result value. During the second test operation, a third BOST device 300 may receive a test request outputted from a communication circuit 260 of the second BOST device 200, may perform a third test operation related to at least one DUT connected thereto, and may store a third test result value. In exemplary embodiments in accordance with principles of inventive concepts, a test request may be transmitted to a downstream device in the above-described manner.

After the first to third test operations are completed, the communication circuit 360 of the third BOST device 300 may output the third test result value of the third test operation to the communication circuit 260 of the second BOST device 200. The communication circuit 260 of the second BOST device 200 may output the second test result value of the second test operation and the third test result value of the third test operation to the communication circuit 160 of the first BOST device 100. The communication circuit 160 of the first BOST device 100 may output the first test result value of the first test operation, the second test result value of the second test operation and the third test result value of the third test operation to an upstream device. In exemplary embodiments in accordance with principles of inventive concepts, a test result values may be transmitted to an upstream device in the above-described manner.

Figure 3:
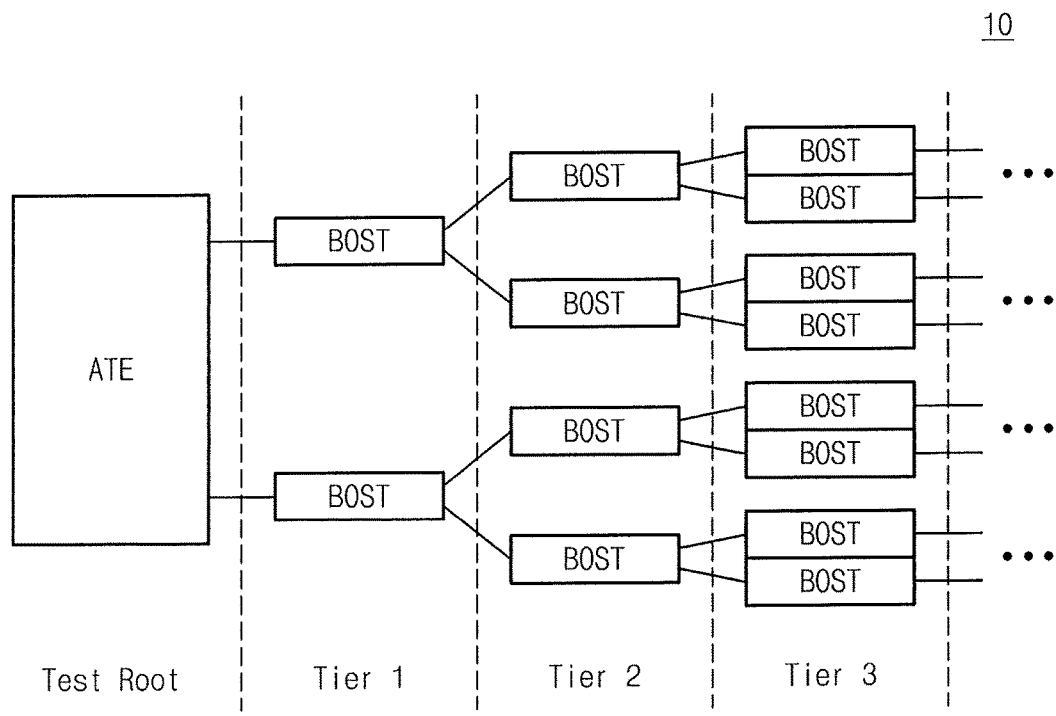
FIG. 3 is a block diagram illustrating a test system according to exemplary embodiments in accordance with principles of inventive concepts.

FIG. 3 is a block diagram illustrating a test system 10 according to an embodiment of exemplary embodiments in accordance with principles of inventive concepts. Referring to FIG. 3, test system 10 may include BOST devices connected to a test root using a binary-tree structure. In exemplary embodiments, the test root may be automatic test equipment (ATE).

In an exemplary embodiment, each of the BOST devices may be implemented to perform a part or all of the ATE function.

In FIG. 3, an exemplary embodiment of in accordance with principles of inventive concepts is exemplified as the test system 10 includes three tiers Tier 1, Tier 2 and Tier 3, but the number of tiers are not limited thereto.

Figure 4A:
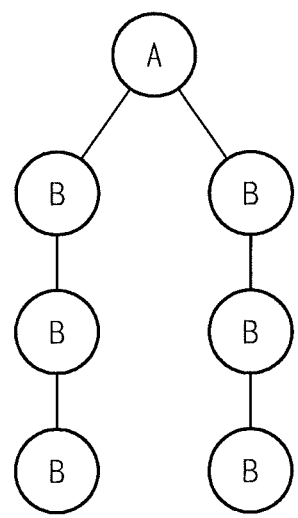
FIGS. 4A and 4B are diagrams illustrating various connection-relations of BOST devices.
Figure 4B:
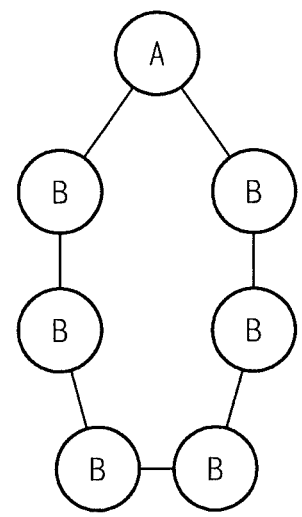

FIGS. 4A and 4B are diagrams illustrating various connection relations of BOST devices in accordance with principles of inventive concepts. Referring to FIG. 4A, BOST devices may be connected using a two-chain form. Referring to FIG. 4B, a test apparatus A and BOST devices B may be connected to form a ring network.

Figure 5:
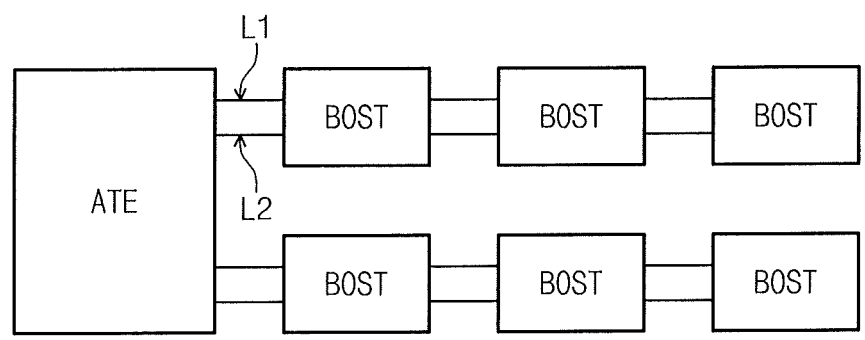
FIG. 5 is a diagram illustrating a connection of two-lane structure of BOST devices according to exemplary embodiments in accordance with principles of inventive concepts.

FIG. 5 is a diagram illustrating BOST devices connected in a two-lane structure, according to an exemplary embodiment in accordance with principles of inventive concepts. Referring to FIG. 5, BOST devices may be serially connected to a test apparatus (for example, ATE) along two lanes L1 and L2. In exemplary embodiments, a first lane L1 may be a transmission-dedicated lane and a second lane L2 may be a receiving-dedicated lane.

In FIGS. 3 to 5, exemplary embodiments of in accordance with principles of inventive concepts are exemplified as a test root is ATE. However, the scope and spirit of inventive concepts are not limited thereto. For example, the test root may be a computer device having a test program.

Figure 6:
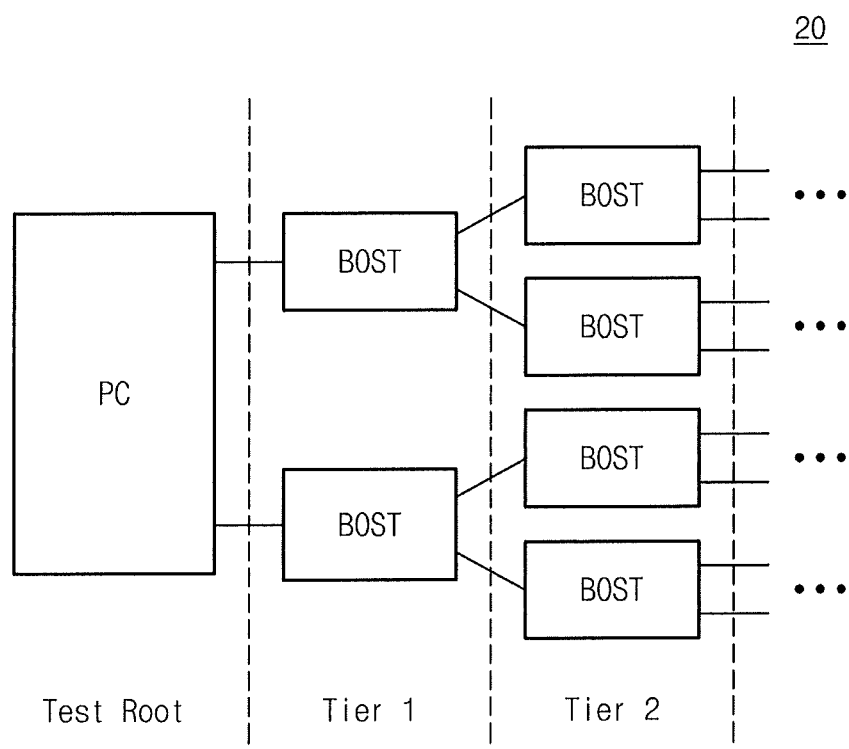
FIG. 6 is a block diagram illustrating a test system according to exemplary embodiments in accordance with principles of inventive concepts.

FIG. 6 is a block diagram illustrating a test system 20 according to other exemplary embodiments in accordance with principles of inventive concepts. Referring to FIG. 6, a test system 20 may include BOST devices connected to a personal computer (PC) using a binary tree structure. In exemplary embodiments, the personal computer (PC) may include a test program as a test root.

In the test systems 10 and 20 in FIGS. 3 and 6, each of the BOST devices may include a self-test function and a communication function. Each of the BOST devices may include a BOST device that exclusively transmits test-related information transmitted and received, that is, performs a communication function. In exemplary embodiments, it may be possible to replace the BOST device exclusively performing a communication function with a buffer chip, for example.

Figure 7:
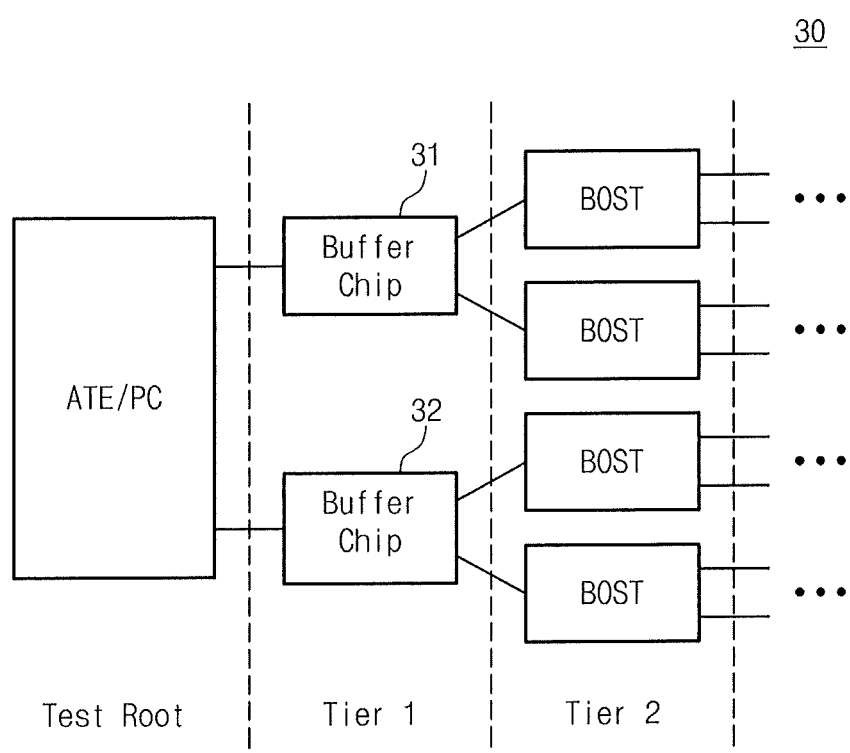
FIG. 7 is a block diagram illustrating a test system according to exemplary embodiments in accordance with principles of inventive concepts.

FIG. 7 is a block diagram illustrating a test system 30 according to another exemplary embodiment in accordance with principles of inventive concepts. Referring to FIG. 7, a first tier of a test system 30 may include buffer chips 31 and 32. Each of the buffer chips 31 and 32 may be implemented to buffer test-related information between a test apparatus (for example, ATE or PC) and BOST devices. Each of the buffer chips 31 and 32 may include the communication circuit 160 illustrated in FIG. 1 to perform data communication with an external apparatus.

In exemplary embodiments, buffer chips may be used to replace remaining BOST devices other than BOST device connected to DUTs.

Figure 8:
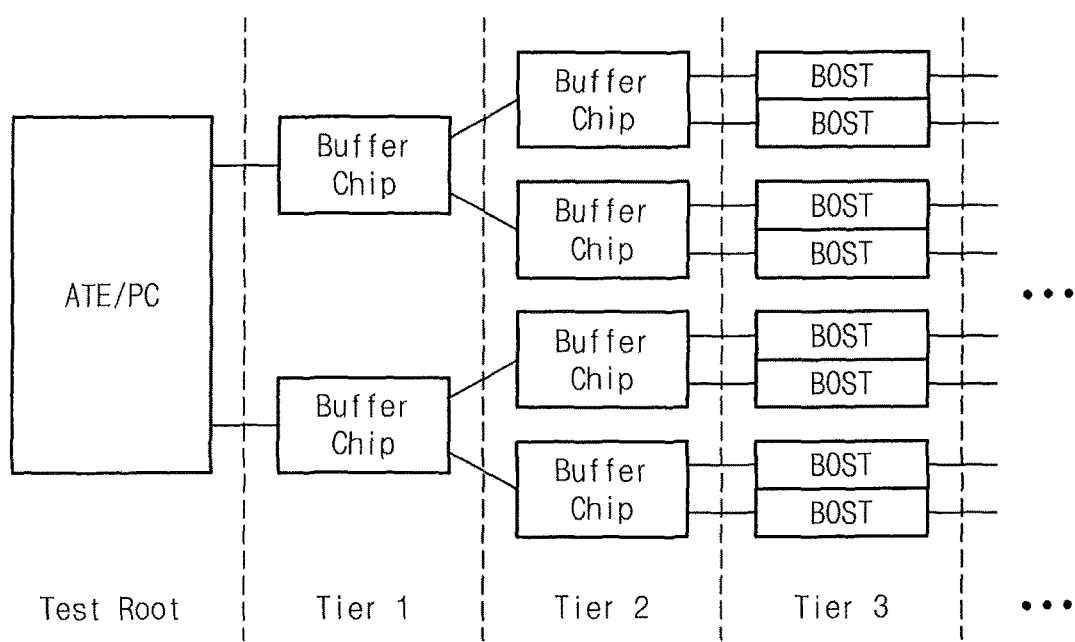
FIG. 8 is a block diagram illustrating a test system according to exemplary embodiments in accordance with principles of inventive concepts.

FIG. 8 is a block diagram illustrating a test system 40 according to another exemplary embodiment in accordance with principles of inventive concepts. Referring to FIG. 8, each of a first tier and a second tier in a test system 40 may include buffer chips.

In exemplary embodiments, a first test clock used at a test apparatus (for example, ATE or PC) and a second test clock used at each of BOST devices may be different from each other. For example, the second test clock used at a BOST device may be faster than the first test clock used at the test apparatus (for example, ATE or PC).

Figure 9:
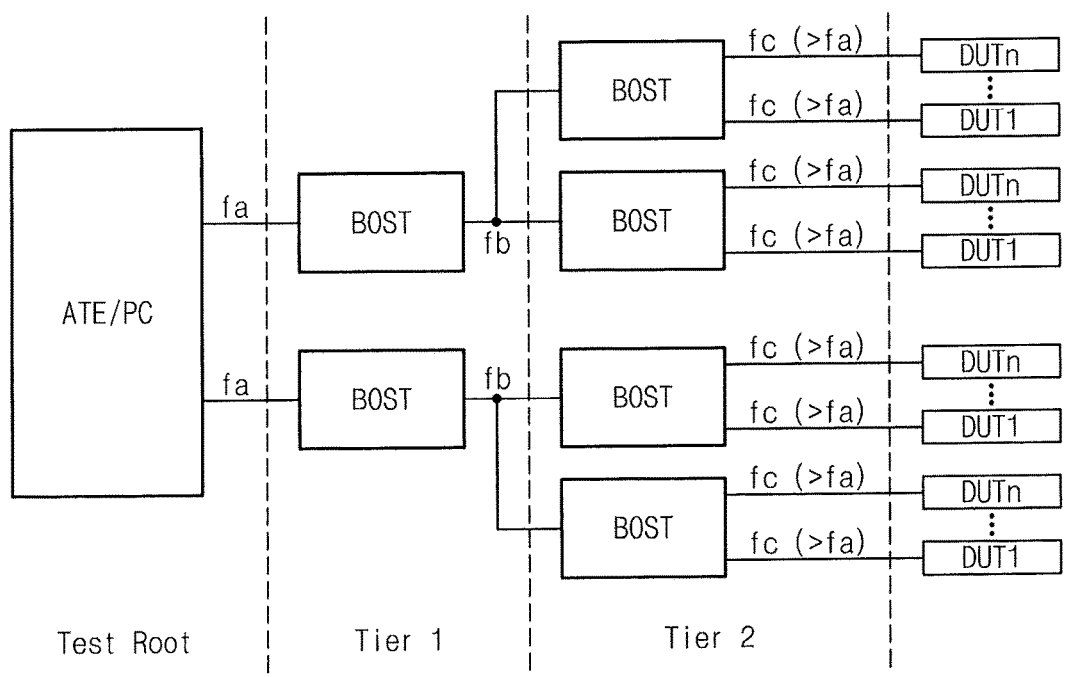
FIG. 9 is a block diagram illustrating a test system in accordance with principles of inventive concepts as viewed from a frequency-domain perspective.

FIG. 9 is a block diagram illustrating a test system 50 viewed from a frequency-domain perspective, according to an exemplary embodiment in accordance with principles of inventive concepts. For convenience of the description in FIG. 9, it may be assumed that n DUTs (n being a natural number of 2 or more) are connected to an end BOST device.

A test apparatus (for example, ATE/PC) may transmit and receive test-related information to and from BOST devices of a first tier using a first frequency fa. The BOST devices of the first tier may transmit and receive the test-related information to and from BOST devices of a second tier using a second frequency fb. The BOST devices of the second tier may perform a test operation related to DUTs DUT1 to DUTn connected using a third frequency fc. In an exemplary embodiment, the third frequency fc may be higher than the first frequency fa. Furthermore, the third frequency fc may be higher than or equal to the second frequency fb.

In general, a test total amount of the ATE may not be changed because data bandwidth physically connected to the ATE is fixed. However, according to exemplary embodiments in accordance with principles of inventive concepts, it may be possible to make a test operating speed of the BOST device faster than that of the ATE, thereby improving the test operating speed.

Figure 10:
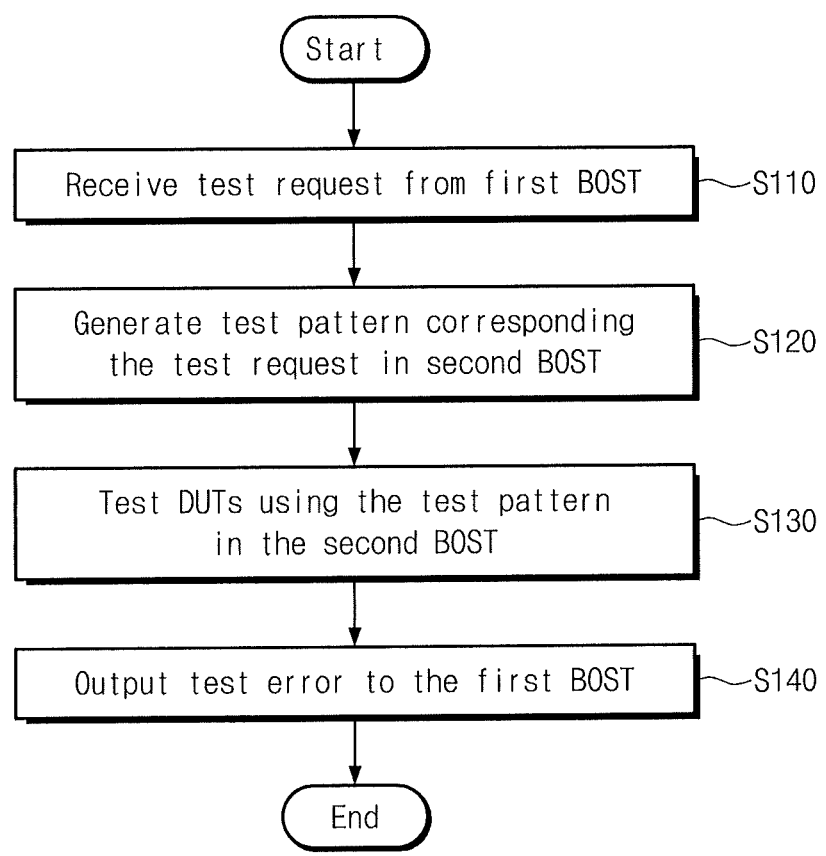
FIG. 10 is a flow chart illustrating a test method of a test system according to an exemplary embodiments in accordance with principles of inventive concepts.

FIG. 10 is a flow chart illustrating a test method of a test system according to exemplary embodiments in accordance with principles of inventive concepts. Referring to FIGS. 1 to 10, the test method may progress as follows.

The second BOST device 200 (refer to FIG. 2) may receive a test request from the first BOST device 100 ("a first auxiliary test device") (refer to FIG. 2) (S100). The second BOST device 200 ("a second auxiliary test device") may generate a test pattern required for the test request in respond to the request (S120). The second BOST device 200 may test the connected DUTs using the test pattern (S130). The second BOST device 200 may transmit a test error to the first BOST device 100 (S140). In exemplary embodiments, the first and second BOST devices 100 and 200 may include the same communication circuit to transmit and receive data.

A test method of a test system according to exemplary embodiments in accordance with principles of inventive concepts may transmit and receive a test request and a test result value between the first BOST device 100 and the second BOST device 200.

In exemplary embodiments, a connection tree (hereinafter referred to as "BOST connection tree") may be mounted to a test board using link relations between BOST devices described in FIGS. 1 to 10. In exemplary embodiments, the test board may include sockets into which DUTs are inserted.

Figure 11:
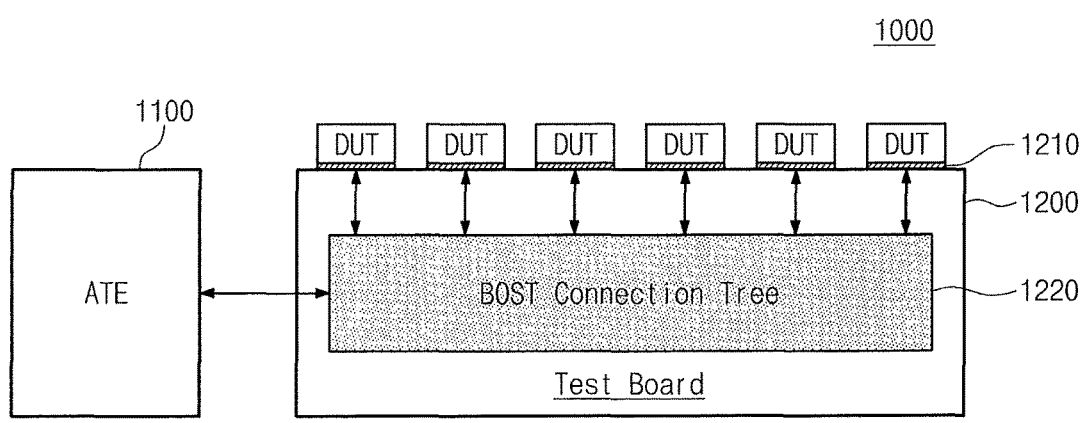
FIG. 11 is a block diagram illustrating a test system having a BOST connection tree.

FIG. 11 is a block diagram illustrating a test system having a BOST connection tree. Referring to FIG. 11, a test system 1000 may include a test apparatus 1100 and a test board 1200. The test board 1200 may include sockets 1210 inserting DUTs and a BOST connection tree 1220. In exemplary embodiments, the BOST connection tree 1220 may include at least one of connections between BOST devices described with reference to FIGS. 1 to 10.

A test apparatus (for example, BOST) which is independent of DUTs is described with reference to FIGS. 1 to 11. However, the scope and spirit of exemplary embodiments in accordance with principles of inventive concepts are not limited thereto. A test apparatus of in accordance with principles of inventive concepts may be included in the DUT and may be implemented to perform a test function and a communication function.

A test device, a test board including the same, and a test method thereof according to an exemplary embodiment of in accordance with principles of inventive concepts may perform communication with an external apparatus, thereby resolving channel constraint of a test operation.

Exemplary embodiments in accordance with principles of inventive concepts described above are only specific embodiments for practicing inventive concepts.

While exemplary embodiments in accordance with principles of inventive concepts has been described with reference to exemplary embodiments, it will be apparent to those skilled in the art that various changes and modifications may be made without departing from the spirit and scope of inventive concepts. Therefore, it should be understood that the above embodiments are not limiting, but illustrative.

What is claimed is:

1. A test board comprising:
   sockets in which a plurality of devices under test (DUTs) may be inserted; and
   an auxiliary test device connection tree configured to electrically connect to the sockets,
   wherein the auxiliary test device connection tree comprises:
   a first auxiliary test device configured to receive a first test request from an external apparatus and output a second test request; and
   a second auxiliary test device configured to generate a test clock and a test pattern in response to the second test request outputted from the first auxiliary test device, to perform a test operation related to at least one of the DUTs, using the generated test pattern, and to output results of the test operation to the first auxiliary test device,
   wherein the second auxiliary test device comprises a built out self-test (BOST) apparatus, the BOST apparatus configured to receive the second test request from the first auxiliary test device,
   wherein the external apparatus is one of automatic test equipment (ATE) and a personal computer (PC), and
   wherein the external apparatus and the auxiliary test device connection tree are connected using a binary-tree structure.

2. The test board of claim 1, wherein the first auxiliary test device is a buffer chip.

3. The test board of claim 1, wherein a frequency of the test clock is higher than that of the external apparatus from which the first test request is received.

4. The test board of claim 1, wherein the second auxiliary test device comprises:
   a DUT interface configured to output a test pattern to the at least one DUT, to receive test result values corresponding to the test pattern from the at least one DUT, to compare the test pattern and the test result values, and to thereby determine whether or not an error has occurred in the DUT;
   a test logic circuit configured to generate the test clock and the test pattern corresponding to the second test request; and
   a communication circuit configured to communicate with the first auxiliary test device.

5. A test board comprising:
   sockets in which a plurality of devices under test (DUTs) may be inserted; and
   an auxiliary test device connection tree configured to electrically connect to the sockets,
   wherein the auxiliary test device connection tree comprises:
   a first auxiliary test device configured to receive a first test request from an external apparatus and output a second test request; and
   a second auxiliary test device configured to generate a test clock and a test pattern in response to the second test request outputted from the first auxiliary test device, to perform a test operation related to at least one of the DUTs, using the generated test pattern, and to output results of the test operation to the first auxiliary test device,
   wherein the second auxiliary test device comprises a built out self-test (BOST) apparatus, the BOST apparatus configured to receive the second test request from the first auxiliary test device,
   wherein the external apparatus is one of automatic test equipment (ATE) and a personal computer (PC), and wherein the external apparatus and the auxiliary test device connection tree are connected using a ring-network structure.

6. An auxiliary test device comprising:
   a DUT (devices under test) interface configured to connect to a plurality of DUTs, to output a test pattern to the DUTs, to receive test result values from the DUTs, and to compare the test pattern and the test result values to determine whether or not an error has occurred in the DUT;
   a test logic circuit configured to generate a test clock or test pattern corresponding to a test request; and
   a communication circuit configured to perform an up-link communication with a first apparatus, and to perform a down-link communication with a second apparatus,
   wherein the communication circuit comprises;
   an up-link transmitter/receiver configured to perform a communication with the first apparatus;
   a down-link transmitter/receiver configured to perform a communication with the second apparatus; and
   a link manipulation circuit configured to control the up-link transmitter/receiver and the down-link transmitter/receiver, and to activate the test logic circuit.

7. The auxiliary test device of claim 6, wherein the DUT interface comprises:
   a driver configured to output the test pattern to the DUTs or to receive the test result values from the DUTs; and
   a comparator configured to compare the test pattern and the test result values.

8. The auxiliary test device of claim 6, wherein the first apparatus is one among automatic test equipment (ATE), a personal computer (PC), and an auxiliary test device.

9. The auxiliary test device of claim 6, wherein the second apparatus is another auxiliary test device.

10. The auxiliary test device of claim 6, wherein the up-link transmitter/receiver and the down-link transmitter/receiver perform data communication using a point to point protocol (PPP) interface.

11. The auxiliary test device of claim 6, wherein the auxiliary test device is implemented using field programmable gate array (FPGA) or an application specific integrated circuit (ASIC).

* * * * *